Figure 1:
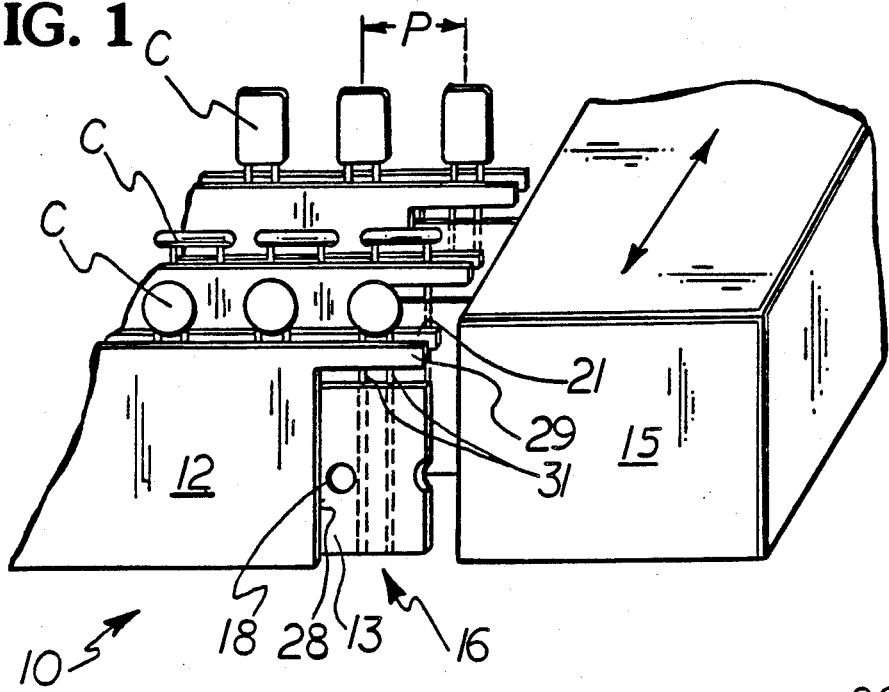

United States Patent [19]

St. Hilaire

[11] Patent Number: 4,938,407
[45] Date of Patent: Jul. 3, 1990

[54] INACTIVE FEEDER FOR RADIAL COMPONENT INSERTION MACHINE

[75] Inventor: Vance F. St. Hilaire, Beverly, Mass.

[73] Assignee: Emhart Industries, Inc., Hartford, Conn.

[21] Appl. No.: 420,418

[22] Filed: Oct. 12, 1989

[51] Int. Cl.⁵ .................... B65H 5/00; B65H 23/28
[52] U.S. Cl. ................................ 226/196; 221/71
[58] Field of Search ............. 226/196, 91, 92; 414/20, 14; 221/70, 71, 74

[56] References Cited

U.S. PATENT DOCUMENTS

| | | | |
|---|---|---|---|
| 2,043,651 | 6/1936 | Boden | 221/71 X |
| 2,079,005 | 5/1937 | Freydberg | 221/70 |
| 3,167,266 | 1/1965 | Stibitz | 226/92 |

FOREIGN PATENT DOCUMENTS 0133549  1/1979  Fed. Rep. of Germany ...... 226/196

Primary Examiner—Stanley N. Gilreath
Assistant Examiner—Paul Thomas Bowen
Attorney, Agent, or Firm—Spencer T. Smith

[57] ABSTRACT

An inactive feeder supports a lead tape having evenly spaced sprocket holes and components within a feed channel. Pairs of ball detents spaced at the same pitch forcefully enter corresponding sprocket holes when the lead tape is incremented to precisely locate and hold the lead tape.

3 Claims, 1 Drawing Sheet

INACTIVE FEEDER FOR RADIAL COMPONENT INSERTION MACHINE

The present invention relates to machines for inserting radial components into circuit boards and the like. In such machines, the radial components to be inserted may be secured to a single lead tape in the desired sequence or the components may be secured to a plurality of lead tapes each carrying identical components. In the first case, a picker removes the components from the one lead tape in the desired sequence, and in the other case, a picker defines the sequence by components from their lead tapes.

It is an object of the present invention to provide an inactive feeder for such lead tapes of radial components whether sequenced or identical.

Other objects and advantages of the present invention will become apparent from the following portion of the specification and from the following drawings which illustrate in accordance with the mandate of the patent statutes a presently preferred embodiment incorporating the principles of the invention.

Figure 2:
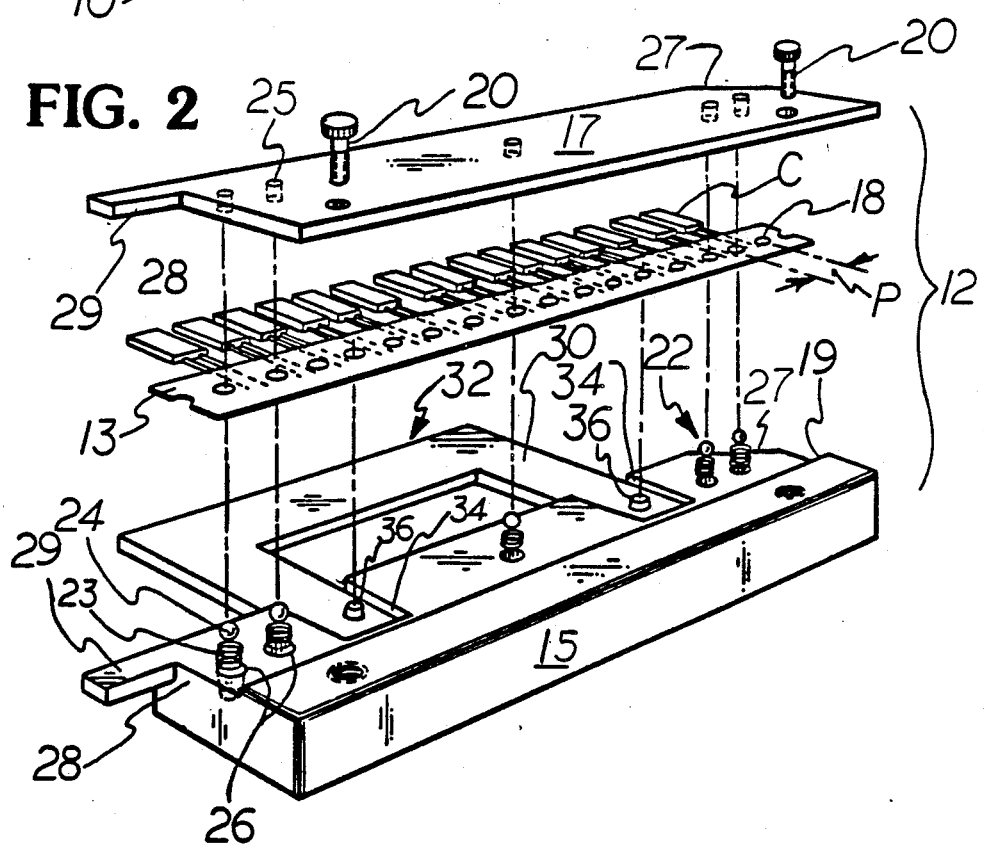

Referring to the drawings:

FIG. 1 is an oblique view of a portion of a machine for inserting radial components into a circuit board or the like; and FIG. 2 is an oblique exploded view of one of the inactive feeders illustrated in FIG. 1.

The radial component insertion machine includes a stationary component magazine 10 which has a plurality of inactive feeders 12. As illustrated, each inactive feeder 12 presents a lead tape 13 of identical components C to a movable picker 15 which is displaceable transversely along the magazine and which cuts a taped component located at the ready position 16 of one of the inactive feeders from the lead tape and transfers the taped component to the picker while advancing the lead tape one increment to locate the next identical component at the ready location. The components are secured to the lead tape at a selected spacing which corresponds to the increment of advancement or the sprocket hole 18 pitch P.

Each inactive feeder 17 has a body portion 14 and a retaining plate 17. The body portion has a recess 19 which defines with the retaining plate 16, when it is secured to the body by screws 20, a feed channel 21 for the lead tape 13. When the lead tape is properly located within this channel 21, the components will be located above the feeder and front and rear pairs of ball detents 22 forcefully engage the peripheries of the first and last pairs of sprocket holes 18 in the lead tape, and a middle ball detent 22 engages the periphery of the central sprocket hole 18. Each ball detent 22, which is received within a hole 23 in the body, is made up of a ball 24 (7/32" in the preferred embodiment) which is compressively located by a spring 26. The springs are selected so that the lead tape can be easily pulled along the channel in feed increments of one pitch length and the ball detents function to precisely locate the lead tape becoming forcefully centered in the sprocket or pitch holes 18. Smaller coaxial thru-holes 25 are defined in the retaining plate 17 so that the ball can be pushed against the periphery of a tape hole 18. The leading top corner 27 of the body portion 14 and retaining plate 17 are bevelled in all directions to facilitate tape entry.

The front of the body 14 and retaining plate 17 are recessed 28 to expose the free end of the lead tape 13 including at least the first full sprocket hole 18. This enables the taped component at the ready position 16 to be gripped by the picker and cut from the lead tape. The horizontally extending projections 29 provide a guide for the leads 31 of the taped component at the ready position 16, and hence, precisely hold the free end of the lead tape.

To remove a lead tape 13 from an inactive feeder 12, the lead tape can simply be pulled rearwardly from the inactive feeder 12. To insert a lead tape into an inactive feeder 12, the pins 36 extending outwardly from the bottom portion of the legs 30 of a "U" shaped tool 32 are inserted into corresponding socket holes 18 in the lead tape 13. The lead tape 13 can then be pushed downwardly into the feed channel 21 by inserting the legs 30 into the body openings 34. Each opening 34 has a horizontal thickness at least equal to the combined thickness of legs 30 and pins 36. Once the lead tape has been fully inserted with the legs engaging the bottom surface of the openings 34, the legs can be pulled horizontally away from the tape freeing the locating pins 36 from the tape whereby the tool can be vertically removed.

I claim:

1. An inactive feeder for a radial component insertion machine comprising
    elongated body means including a downwardly extending channel for receiving a lead tape having evenly spaced sprocket holes and components, the depth of said channel being selected so that the components carried by said received lead tape will be located above said body means,
    a first pair of ball detents at the forward end of said channel for forcefully entering adjacent sprocket holes of the received lead tape, and
    a second pair of ball detents at the rear end of said channel for forcefully entering adjacent sprocket holes of the received lead tape whereby the lead tape can be advanced by an increment equal to the distance between adjacent sprocket holes and said first and second pairs of ball detents will precisely locate the lead tape.

2. An inactive feeder according to claim 1, further comprising a ball detent intermediate said first and second pairs of detents to forcefully enter an intermediate sprocket hole of the received lead tape.

3. An inactive feeder according to claim 2, further comprising
    first and second spaced openings extending downwardly into said body means, said spaced openings communicating with said channel,
    a "U" shaped tool for inserting lead tape into said channel including
    a pair of vertical legs each having a pin projecting horizontally forwardly therefrom configured for insertion into said openings, said pins being selectively sized and located for insertion into sprocket holes of the lead tape whereby the lead tape can be inserted into said channel,
    the combined horizontal thickness of said legs and said pins being selected so that after the tape has been inserted, said tool can be horizontally displaced to remove said pins from the sprocket holes whereby said tool can be removed from said openings.

* * * * *